US012154638B2

(12) United States Patent
Wang et al.

(10) Patent No.: US 12,154,638 B2
(45) Date of Patent: Nov. 26, 2024

(54) TECHNIQUES FOR ANALOG MULTIBIT DATA REPRESENTATION FOR IN-MEMORY COMPUTING

(71) Applicant: Intel Corporation, Santa Clara, CA (US)

(72) Inventors: Hechen Wang, Hillsboro, OR (US); Richard Dorrance, Hillsboro, OR (US); Renzhi Liu, Portland, OR (US); Deepak Dasalukunte, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 568 days.

(21) Appl. No.: 17/353,493

(22) Filed: Jun. 21, 2021

(65) Prior Publication Data

US 2022/0406392 A1    Dec. 22, 2022

(51) Int. Cl.
*G11C 27/02*     (2006.01)
*G06N 3/063*     (2023.01)

(52) U.S. Cl.
CPC ........... *G11C 27/024* (2013.01); *G06N 3/063* (2013.01)

(58) Field of Classification Search
CPC ....... G11C 27/024; G11C 27/026; G11C 7/16; G11C 7/12
See application file for complete search history.

(56) References Cited

U.S. PATENT DOCUMENTS

| 2012/0133538 | A1* | 5/2012 | Choi | G11C 13/0002 |
| | | | | 341/154 |
| 2022/0012016 | A1* | 1/2022 | Wang | G06F 7/5443 |

* cited by examiner

*Primary Examiner* — Han Yang
(74) *Attorney, Agent, or Firm* — NICHOLSON DE VOS WEBSTER & ELLIOTT LLP

(57) ABSTRACT

Various embodiments provide apparatuses, systems, and methods for multibit analog representation, e.g., for in-memory computing. Embodiments may include a single-ended or differential ladder network to generate an analog value (e.g., a voltage or charge) based on a set of bits from a memory array. The ladder network may include a plurality of branches coupled to an output line, wherein individual branches include a capacitor with a first terminal coupled to the output line and a switch coupled to a second terminal of the capacitor. The switch may be controlled by a respective bit of the set of bits to selectively couple the second terminal of the capacitor to a first voltage node or a second voltage node based on a value of the respective bit. Other embodiments may be described and claimed.

25 Claims, 11 Drawing Sheets

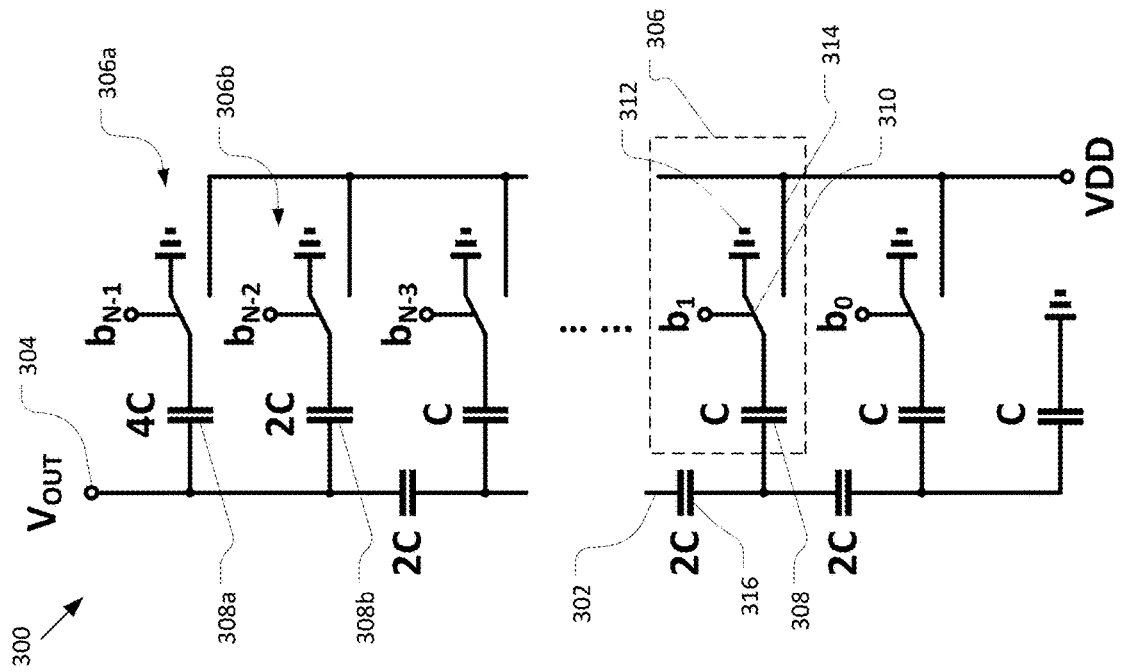
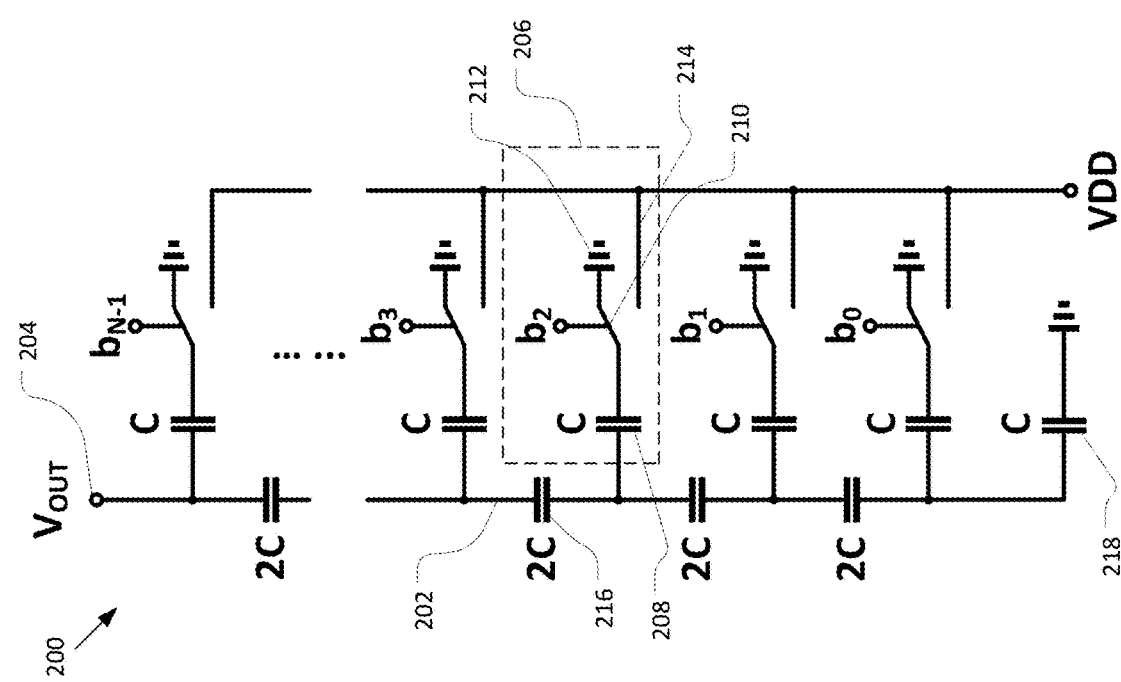
Figure 3
Figure 2

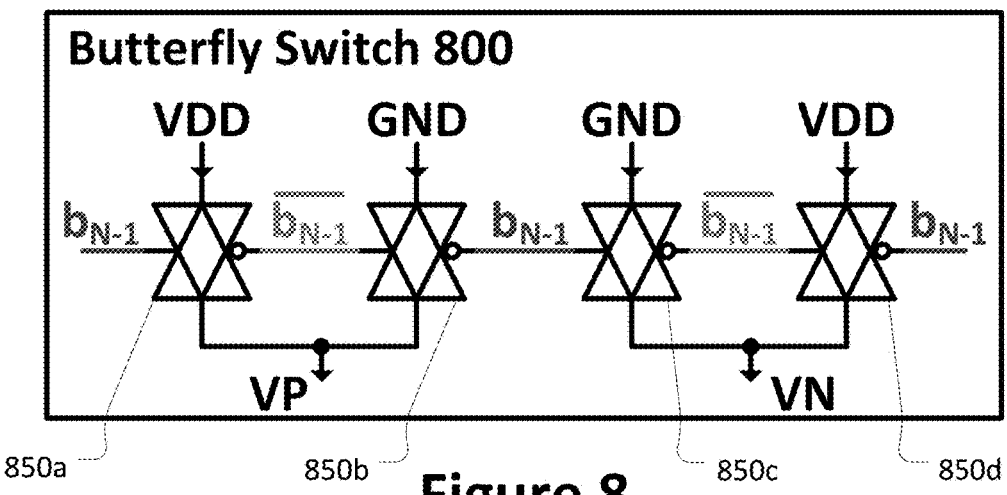
Figure 8
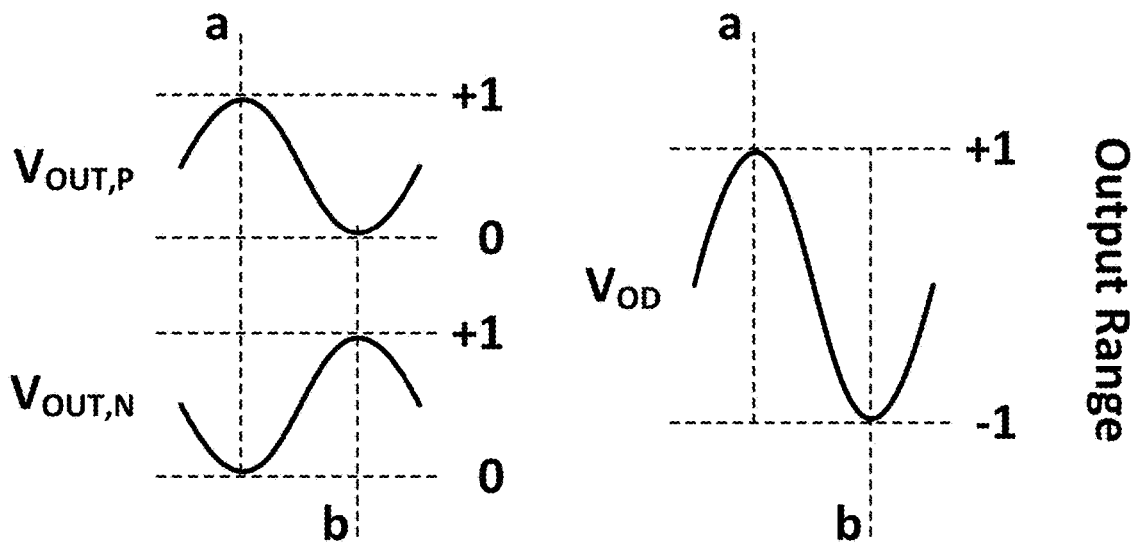
Figure 9
Figure 10

TECHNIQUES FOR ANALOG MULTIBIT DATA REPRESENTATION FOR IN-MEMORY COMPUTING

FIELD

Embodiments of the present invention relate generally to the technical field of electronic circuits, and more particularly to techniques for analog multibit data representation.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Due to the extraordinary power and hardware efficiency, binary analog in-memory computing neural network has gained popularity recently in the field of artificial intelligence hardware implementation. However, as the binary neural network (BNN) quantizes all the data in the network into only two discrete levels, a great portion of detailed information is lost, which results in handling only some low-end inference tasks, such as handwritten digit recognition. Therefore, designers have start looking for multibit solutions. In a multibit analog in-memory computing neural network, since the data is stored in digital format inside memory cells, a digital-to-analog conversion is unavoidable before sending it for analog signal processing.

Several techniques have been introduced to represent the multibit digital data in analog domain, including pulse width modulation (PWM) and voltage-controlled modulation (VCM). However, these approaches face some critical issues, such as scalability or limited number of bit (NoB), and the nonlinearity of the multibit data representation. A large nonlinearity further degrades the actual effective number of bits and eventually jeopardizes the classification accuracy during the inference.

Bypassing the nonlinearity issue, the binary representation is currently the most adopted approach. There are a few multibit data representation methods available as well. PWM is one of the widely adopted approach among them. The standard static random-access memory (SRAM) cell consists of an inverter-based latch and a pair of bit read/write transistors. During the cycle when the read/write signal is logic high, the system is able to read the content stored in the SRAM cell. In a conventional digital system, one cycle period is set to be long enough for the voltage on the output node to be settled. In the PWM-based multibit representation scheme, the time interval is much shorter for the SRAM to charge the output to its stable state. As a result, the amount of charge on the node corresponds to the length of the pulse. By adjusting the pulse width in a binary manner, this technique is able to provide different weights to different SRAM cells and separate the most significant bits (MSBs) and least significant bits (LSBs).

VCM is another technique for multibit data representation. Instead of modulating the SRAM cell access time interval, VCM modulates the voltage applied to the read/write transistors. The weight information for each SRAM cell is given by different voltage levels.

Both PWM and VCM have several disadvantages. For example, for a large NoB data, the ratio between MSB and LSB is large. Taking an 8-bit NoB scenario for an example, the MSB is 128 ($2^{8-1}$) times larger than the LSB, which means if the LSB is using 1 nanosecond (ns) as the pulse width in PWM approach, the MSB needs to have a pulse width of 128 ns. Additionally, for VCM, if the voltage for the MSB is 1 volt, then the voltage for the LSB is 8 mV. The consequences of using such a long time period to charge the capacitor or a tiny voltage level to modulate the transistor include an over complicated circuit design, which would destroy much or all of the benefit offered by the analog in-memory computing. As a result, these techniques do not scale very well.

Apart from the scalability limitation, these techniques suffer from nonlinearity issues as well. PWM uses the time-to-voltage transfer relation in capacitor charging, while VCM is using the transfer relation of the metal-oxide-semiconductor field-effect transistor (MOSFET) transistor. Both of these relations belong to a first order system response, which has a nonlinear transfer function. As a result, the actual effective number of bits is much lower than the designers' expectation and additional calibration or predistortion is required to mitigate their nonlinearity.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2 illustrates a C-2C ladder network to convert a set of digital bits to an analog value, in accordance with various embodiments.

FIG. 3 illustrates a modified C-2C ladder network to convert a set of digital bits to an analog value, in accordance with various embodiments.

FIG. 8 illustrates an example butterfly switch that may be used in a differential ladder network of FIG. 7, in accordance with various embodiments.

FIG. 9 illustrates an example input data format of a differential ladder network, in accordance with various embodiments.

FIG. 10 illustrates an example output range of an output signal of the differential ladder network, in accordance with various embodiments.

DETAILED DESCRIPTION

Figure 1:
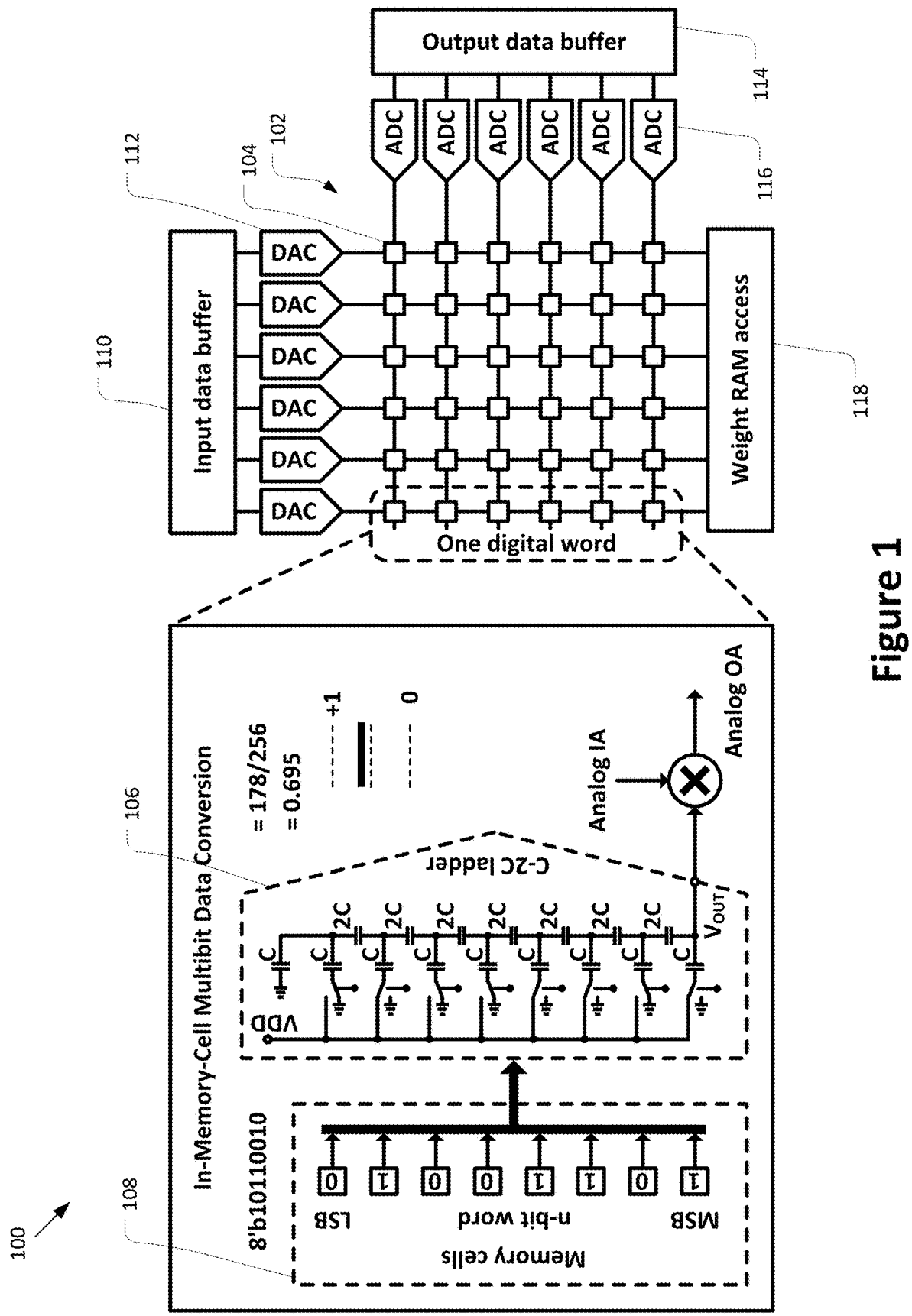
FIG. 1 illustrates a circuit for in-memory multibit analog computing, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments herein provide techniques for in-memory multibit analog computing. For example, embodiments include a circuit that includes a memory array and a ladder network. The memory array may include a plurality of memory cells to store respective bits. The ladder network may be coupled to the memory array to convert a set of the bits (e.g., a "word") to an analog value (e.g., a charge and/or voltage). In embodiments, the circuit may be used for in-memory computing, such as in a neural network.

The ladder network may include an output line coupled to an output terminal to provide the analog value, and a plurality of branches coupled to the output line. The branches may include a capacitor with a first terminal coupled to the output line and a switch coupled to the second terminal of the capacitor. The switch may receive a respective bit of the set of bits as a control signal. The switch may selective couple the second terminal of the capacitor to a first voltage or a second voltage based on a value of the respective bit. In some embodiments, such as when the ladder network is a single-ended ladder network, the first voltage may be a ground potential and the second voltage may be a supply voltage (e.g., VDD). In other embodiments, such as when the ladder network is part of a differential ladder network that includes two ladder networks to generate respective components of a differential output signal, the first voltage may be half of a supply voltage (e.g., VDD/2) and the second voltage may be a selected one of the ground potential or the supply voltage depending on the value of a magnitude bit.

In some embodiments, the ladder network may include scaling capacitors coupled along the output line between respective branches of the plurality of branches. In some embodiments, the capacitors of the branches may all have a first capacitance value (C) that is the same for all of the branches. Additionally, in some embodiments, all of the scaling capacitors may have a second capacitance value (2C) that is twice the first capacitance value. Such a ladder network may be referred to as a C-2C ladder network.

In other embodiments, a modified C-2C ladder network may be used, in which the capacitor of one or more of the branches has a different capacitance value than the first capacitance value, C. In one example, the capacitor of the branch that is closest to the output terminal may have a capacitance of 4C, and the capacitor of the branch that is second closest to the output terminal may have a capacitance of 2C. There may not be a scaling capacitor on the output line between these closest two output terminals. The remainder of the branches may have capacitors of the same value (e.g., the first capacitance value), and may have scaling capacitors on the output line between them. Other modifications of the C-2C ladder network may be used in some embodiments.

Additionally, other embodiments may include different configurations of a ladder network. Some further examples are discussed below with respect to FIGS. 2-5 and 7.

Figure 6:
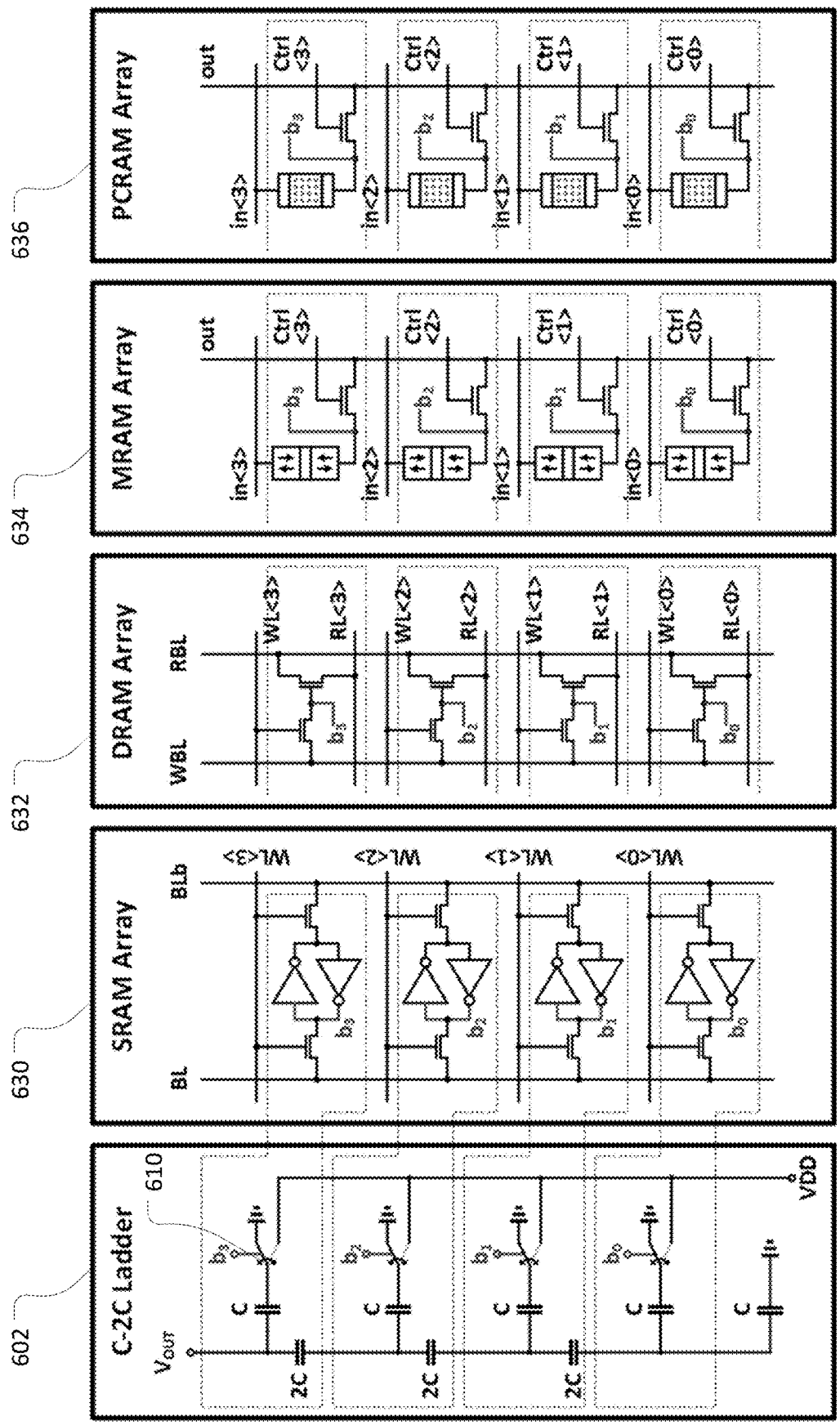
FIG. 6 illustrates a ladder network coupled to different types of memory arrays, in accordance with various embodiments.

In-memory analog signal processing may have some requirements to be practically implemented. For example, it requires all the input data to be presented in analog format such as voltage level, time interval or charge amount. Currently, the data in memory cells is stored in digital domain in most cases. Thus, a technique that represents digital data in analog values is essential in this system. Another aspect is that the reserved space for implementing the representation method is limited, since all the unit memory cells typically use as few components as possible to achieve higher storage density. For instance, as shown in FIG. 6 (discussed further below), the component counts for SRAM, dynamic random access memory (DRAM), magnetoresistive random-access memory (MRAM), and phase-change random-access memory (PCRAM) may include six transistors, two transistors, one transistor plus one magnetoresistive device, and/or one transistor plus one phase-change device, respectively. Other configurations of memory cells may also be used, such as two transistor and two device topology for MRAM and/or PCRAM, eight transistor (8T) or ten transistor (10T) SRAM, and/or three transistor (3T) DRAM. Additionally, or alternatively, other types of memory cells may be used with the techniques described herein, such as ferroelectric random-access memory (FeRAM), flash memory, and/or another suitable type of memory.

In general, it is beneficial for the area occupied by the multibit analog representation circuitry to be in the same order of magnitude of the memory cells. Otherwise, it may not be efficiently used in the in-memory computing topology.

The ladder network described herein may meet these requirements for in-memory analog computing and provide several advantages over other techniques, including scalability to a higher number of bits, linearity in the multibit representation, compact layout, low power consumption, and/or other advantages. Additionally, the implementation of the capacitors for some embodiments may be more area efficient, more precise, and/or simpler to manufacture than other configurations, as further discussed below.

FIG. 1 schematically illustrates a multi-bit data conversion process for in-memory computing in accordance with various embodiments. An in-memory computing circuit 100 (hereinafter "circuit 100") may include a memory array 102 with a plurality of memory cells 104 to store respective digital bits. A ladder network 106 may be coupled to the memory array 102 to convert a set of bits 108 from the memory cells 104 to an analog value. For example, the set of bits 108 may correspond to a word of the memory array 102. The components and functionality of example embodiments of the ladder network 106 will be described further below with reference to FIGS. 2-10.

The circuit 100 may further include an input data buffer 110 coupled to the memory cells 104 via one or more digital-to-analog converters (DACs) 112, and an output data buffer 114 coupled to the memory cells 104 via one or more analog-to-digital converters (ADCs) 116. Additionally, the circuit 100 may further include a weight RAM access circuit 118 coupled to the memory array 102 to write digital data to the memory cells 104.

In embodiments, circuit 100 may be used to implement a neural network. The digital weight information may be preloaded into the memory cells via the weight RAM access circuit 118 and converted to an analog signal using the ladder network 106 as described herein. Digital input activation from the input data buffer 110 may be converted to an analog signal by the DACs 112. These two analog signals may interact to generate an analog output signal, which may be digitized by the ADCs 116 and provided to the output data buffer 114.

FIG. 2 illustrates an example of a ladder network 200 to convert a set of digital bits to an analog value (e.g., a charge and/or voltage), in accordance with various embodiments. The ladder network 200 may include an output line 202 coupled to an output terminal 204 to provide the analog value, and a plurality of branches 206 coupled to the output line. The individual branches 206 may include a capacitor 208 with a first terminal coupled to the output line and a switch 210 coupled to the second terminal of the capacitor 208.

The switch 210 may receive a respective bit (e.g., $b_0$, $b_1$, ... $b_{N-1}$) of the set of bits as a control signal. The switch 210 may selectively couple the second terminal of the capacitor to a supply voltage 212 (e.g., VDD) or a ground potential 214 based on a value of the respective bit. The switch 210 may include any suitable components or configuration, such as two or four transistors. In some embodiments, the number of transistors in the switch 210 may depend on the input load to be presented to the switch 210.

In various embodiments, the ladder network 200 may further include scaling capacitors 216 coupled along the output line 202 between respective branches 206 of the plurality of branches 206. In some embodiments, the capacitors 208 of the branches 206 may all have a first capacitance value (C), as shown. Additionally, the scaling capacitors 216 may all have a second capacitance value (2C) that is twice the first capacitance value. Such a ladder network may be referred to as a C-2C ladder network.

In some embodiments, the ladder network 200 may further include a capacitor 218 coupled between an end of the output line 202 (opposite the output terminal 204) and the ground potential 214. The capacitor 218 may have the same first capacitance value (C) as the capacitors 208 of the branches 206. The capacitor 218 may provide further scaling of the contribution of branches 206 to the analog value generated by the ladder network 200 to enable use of the full dynamic range of ground to VDD.

In embodiments, $b_0$ may be a least-significant bit (LSB) of the set of bits, and $b_{N-1}$ may be a most-significant bit (MSB) of the set of bits. Accordingly, the branches 206 coupled to the output line 202 closer to the output terminal 204 may receive more significant bits. The scaling capacitors 216 may cause the branches 206 to see different effective capacitance between the respective branch 206 and the output terminal 204, thereby scaling the charge contribution of the respective branch 206 to the analog value output by the ladder network 200. The branches 206 that are closer to the output terminal 204 may provide a greater contribution to the analog value, e.g., by a factor of 2 for each successive branch 206 (e.g., a contribution of ½, ¼, ⅛, etc., to a dynamic range of the analog value as the respective branch 206 is coupled to output line 202 further from output terminal 204).

The ladder network 200 may provide several advantages over other techniques, including scalability to a higher number of bits, linearity in the multibit representation, compact layout, and/or low power consumption, among other advantages. Additionally, the implementation of the capacitors may be more area efficient, more precise, and/or simpler to manufacture than other configurations since the capacitors 208, 216, and 218 have only two capacitance values and the second capacitance value is double the first capacitance value. For example, for the C-2C ladder network 200 shown in FIG. 2, the total capacitance required may be 3N−1, where N is the first capacitance value (C). Additionally, the uniform structure of the C-2C ladder network 200 may facilitate large-scale deployment. In some embodiments, the capacitors 208, 216, and/or 218 may be implemented with back-end-of-line (BEOL) capacitors (e.g., above the active region of the memory cells), thereby providing efficient area usage. For example, the capacitors 208, 216, and/or 218 may be passive metal-oxide-metal (MOM) capacitors, metal-insulator-metal (MIM) capacitors, capacitor over bitline (COB) capacitors, and/or another suitable type of capacitors.

FIG. 3 illustrates another ladder network 300 in accordance with various embodiments. The ladder network 300 may be a modification of the C-2C ladder network 200 of FIG. 2.

The ladder network 300 may include a plurality of branches 306 coupled to an output line 302. Each of the branches 306 may include a capacitor 308, and a switch 310 similar to the capacitor 208 and switch 210, respectively, of ladder network 200. However, in ladder network 300, the capacitor 308 of at least one of the branches 306 may have a different capacitance value than the capacitors 308 of other branches 306. For example, as shown in FIG. 3, the branch 306 that is coupled to the output line 302 closest to the output terminal 304 (indicated as 306a) has a capacitor 308a with a capacitance value of 4C. The branch 306 that is next closest to the output terminal 304 (indicated as 306b) has a capacitor 308b with a capacitance value of 2C. The capacitors 308 of the remaining branches 306 have a capacitance value of C. Additionally, as shown in FIG. 3, there may not be a scaling capacitor 316 on the output line 302 between the branches 306a and 306b. There may be scaling capacitors 316 on the output line 302 between the remaining branches 306. The scaling capacitors 316 may have a capacitance value of 2C.

In various embodiments, the ladder network 300 may generate an output analog value at the output terminal 304 that is the same as the output analog value generated by the ladder network 200 for a given set of input bits. However, the ladder network 300 may present a greater output capacitance at the output terminal 304 than the ladder network 200. The greater output capacitance may be advantageous in some implementations. For example, the achievable bit-width of an ADC may be limited by the thermal noise (kT/C), which may be reduced by increasing the capacitance. Additionally, or alternatively, there may be parasitic capacitance introduced by cross-coupling of connection conductors or other structures tied to the output node. A relatively larger output capacitance may mitigate the impact of the undesired parasitic capacitance.

Figure 4:
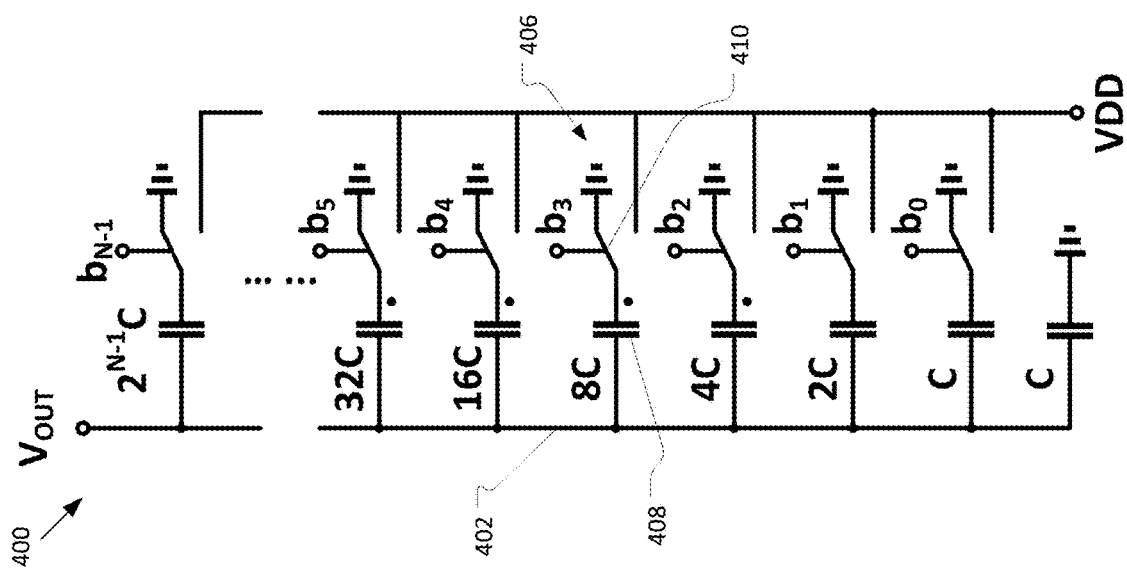
FIG. 4 illustrates a binary weighted capacitor ladder network to convert a set of digital bits to an analog value, in accordance with various embodiments.

FIG. 4 illustrates another ladder network 400 in accordance with various embodiments. The ladder network 400 may include a plurality of branches 406 coupled to an output line 402. Each of the branches 406 may include a capacitor 408 and a switch 410 similar to the capacitor 208 and switch 210, respectively, of ladder network 200. However, the ladder network 400 may not include scaling capacitors on the output line 402. Instead, the capacitance value of the capacitors 408 vary by a factor of 2 from one another (e.g., C, 2C, 4C, . . . $2^{N-1}C$). The ladder network 400 may be referred to as a binary weighted capacitor ladder network.

The ladder network 400 may provide an analog output value that is binary-weighted based on the significance of the input bits (similar to the ladder networks 200 and 300). However, the ladder network 400 uses significantly more units of capacitance than the ladder network 200 and ladder network 300, and the difference increases for larger numbers of bits. For example, for a 10-bit input word, the ladder network 400 uses 1025 capacitance units, while the ladder network 200 uses 29 capacitance units. Thus, the ladder network 400 uses significantly more area than the ladder network 200 and 300. Additionally, the ladder network 400 requires many different capacitance values, thereby increasing implementation complexity.

Figure 5:
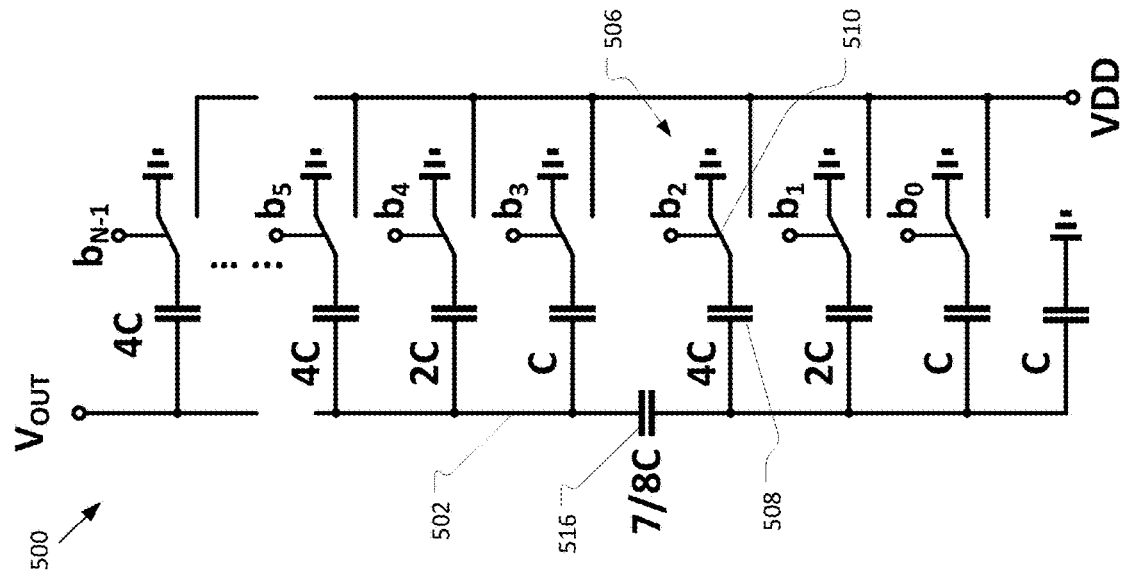
FIG. 5 illustrates a charge scaling capacitor ladder network to convert a set of digital bits to an analog value, in accordance with various embodiments.

FIG. 5 illustrates another ladder network 500 in accordance with various embodiments. The ladder network 500 may include a plurality of branches 506 coupled to an output line 502. Each of the branches 506 may include a capacitor 508 and a switch 510 similar to the capacitor 208 and switch 210, respectively, of ladder network 200. The branches 506 may be grouped into sets of two or more branches, with a scaling capacitor 516 on the output line 502 between the sets. Within each set, the capacitors 508 of the branches 506 may be binary-weighted, as shown.

The ladder network 500 may use less area than the ladder network 400, but still more than the ladder network 200 and 300. For example, for a 10-bit input word, the ladder network 500 uses 65 capacitance units. Additionally, the ladder network 400 may require a fractional value of the scaling capacitor 516 compared with the capacitance unit of the capacitors 508.

FIG. 6 illustrates a ladder network 602 coupled to different types of memory arrays, in accordance with various embodiments. For example, an SRAM array 630, a DRAM array 632, a MRAM array 634, and a PCRAM array 636 are depicted in FIG. 6. Other types of memory arrays may be used in various embodiments.

The ladder network 602 includes a plurality of branches 606 that each include a switch 610. The switches 610 receive a bit from respective memory cells of the memory array as a control signal, as discussed herein. Example locations in the memory circuits 630, 632, 634, and 636 to which the control terminal of the switch 610 may be coupled to receive the respective bit are indicated by $b_0$, $b_1$, $b_2$, and $b_3$. The ladder network 602 depicted in FIG. 6 is a C-2C ladder network similar to ladder network 200 of FIG. 2. Other types of ladder networks may be used in other embodiments, such as the ladder network 300, 400, and/or 500.

Additionally, while 4 bits are depicted in FIG. 6, it will be apparent that embodiments herein may be used with any suitable number of bits.

Figure 7:
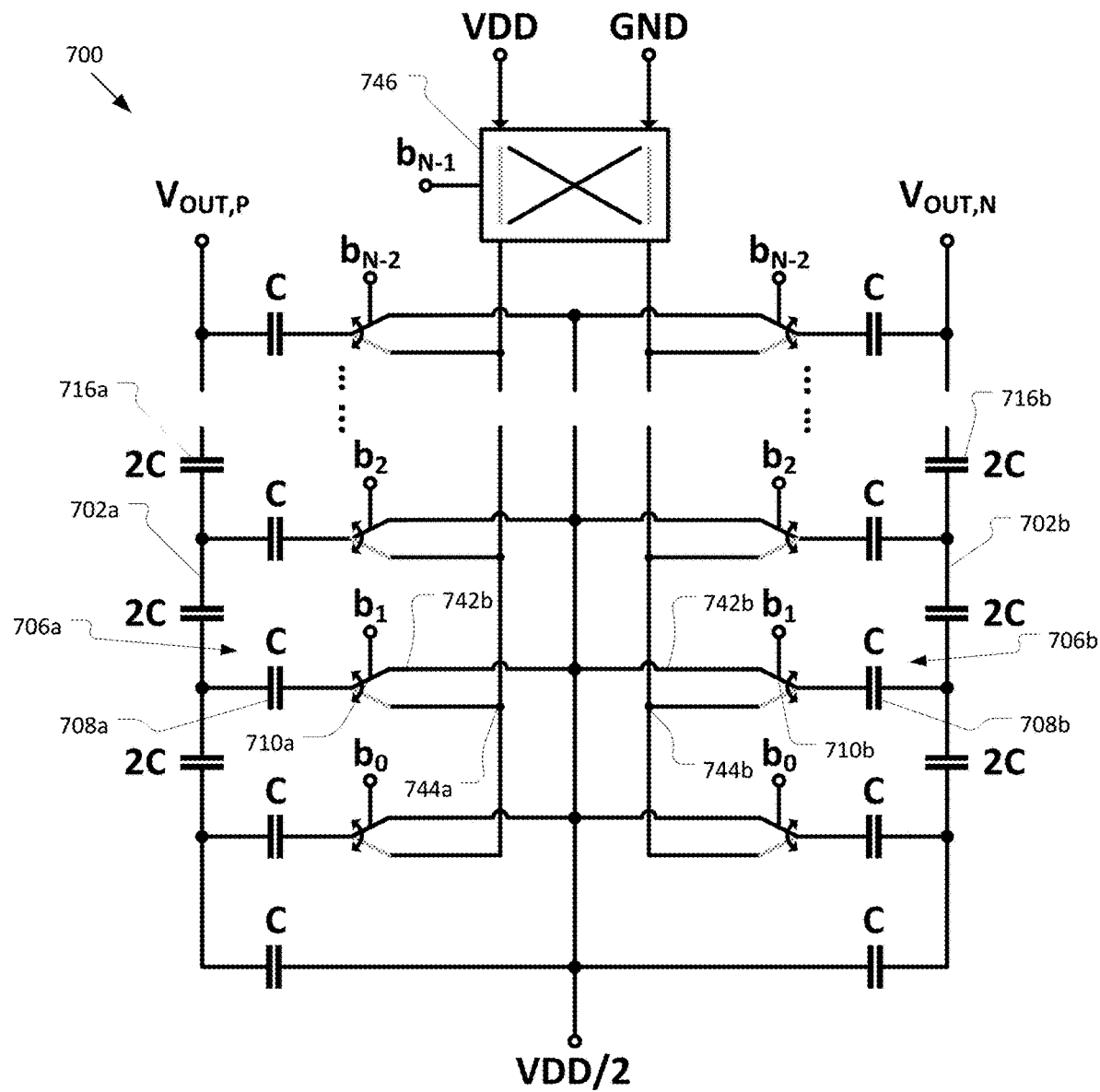
FIG. 7 illustrates a differential ladder network, in accordance with various embodiments.

FIG. 7 illustrates a differential ladder circuit 700 in accordance with various embodiments. The differential ladder circuit 700 may include two ladder networks 701a and 701b that generate respective analog values (e.g., $V_{OUT,P}$ and $V_{OUT,N}$) that combine to provide a differential value. For example, the differential ladder circuit 700 may enable representation of both positive and negative values with a sign-magnitude data format. In some embodiments, the ladder networks 701a-b may correspond to the C-2C ladder network 200, as shown in FIG. 7. In other embodiments, a different type of ladder network configuration may be used, such as ladder network 300, 400, and/or 500.

In various embodiments, the ladder networks 701a-b may include a plurality of branches 706a-b coupled to an output line 702a-b. Each of the branches 706a-b may include a capacitor 708a-b, and a switch 710a-b similar to the capacitor 208 and switch 210, respectively, of ladder network 200. The ladder networks 701a-b may further include scaling capacitors 716a-b on the output line 702a-b between the branches 706a-b.

The switch 710a-b may receive a respective bit of a set of bits, and selectively couple the capacitor 708a-b to a first voltage node 742a-b or a second voltage node 744a-b based on the value of the respective bit. In embodiments, the set of bits may correspond to magnitude bits of a word from a corresponding memory array (e.g., $b_0$ to $b_{N-2}$). The word may further include a sign bit (e.g., $b_{N-1}$) that indicates a sign (e.g., + or −) of the word. The sign bit may be the MSB or another bit of the word. The sign bit may be provided to a sign switch 746 (e.g., a butterfly switch).

The first voltage nodes 742a-b of both of the ladder networks 701a-b may be coupled to a first voltage (VDD/2). The second voltage nodes 744a-b may be coupled to the sign switch 746. The sign switch 746 may couple one of the second voltage nodes 744a or 744b to a second voltage (VDD) and the other second voltage node 744a or 744b to a ground potential based on the sign bit. The second voltage may be twice the value of the first voltage.

A differential signal may provide some advantages over a single-ended signal for analog signal processing. For example, the differential nature provides the first order common mode rejection. Any error introduced by ambient environment will be cancelled automatically. Additionally, the differential signal offers a signal dynamic range twice that of the signal-ended signal. A larger dynamic range leads to better signal-to-noise ratio (SNR). Furthermore, a differential signal is able to represent negative values in analog domain, which may be important for some computation tasks. The range of the single-ended signals are regulated by the operating power supply, which is normally between the voltage supply (VDD) and ground (GND). Consequently, only positive values can be expressed in the limited range.

For the differential ladder circuit 700, the differential output, $V_{OD}$, may be formed by the difference of the $V_{OUT,P}$ and $V_{OUT,N}$, in a range between −1 to +1. For example, the differential output $V_{OD}$ for an N-bit ladder may be given by:

$$V_{OD} = -\text{sign}(b_{N-1}) \times \sum_{i=0}^{N-2} b_i \times \frac{1}{2^{N-i}}$$

FIG. 8 illustrates an example butterfly switch 800 that may correspond to the sign switch 746 in some embodiments. The butterfly switch 800 may include transmission gates 850a-d, as shown. The transmission gates 850a and 850d may receive the second voltage (VDD) and the transmission gates 850b and 850c may receive the ground potential. The control terminals of the transmission gates 850a-d may receive the sign bit or the sign bit bar, as shown. Based on the value of the sign bit, one of the transmission gates 850a or 850b may be on to pass either the second voltage or the ground potential to the second voltage node 744a of ladder network 701a. Additionally, one of the transmission gates 850c or 850d may be on to pass either the second voltage or the ground potential to the second voltage node 744b or the ladder network 701b.

FIG. 9 illustrates an example format of an input word, including a sign bit $b_{N-1}$ and a set of magnitude bits $b_{N-2}$ to $b_0$, in accordance with various embodiments. FIG. 9 also illustrates two examples of an input word and a corresponding differential value.

FIG. 10 illustrates an output range of the component output values $V_{OUT,P}$ and $V_{OUT,N}$ generated by ladder networks 701a and 701b, respectively, and the output range of the corresponding differential analog value $V_{OD}$. As shown, for component output values $V_{OUT,P}$ and $V_{OUT,N}$ with a range of 0 to 1, the output range of the corresponding differential analog value $V_{OD}$ is −1 to +1.

Linearity Results

Figure 11A:
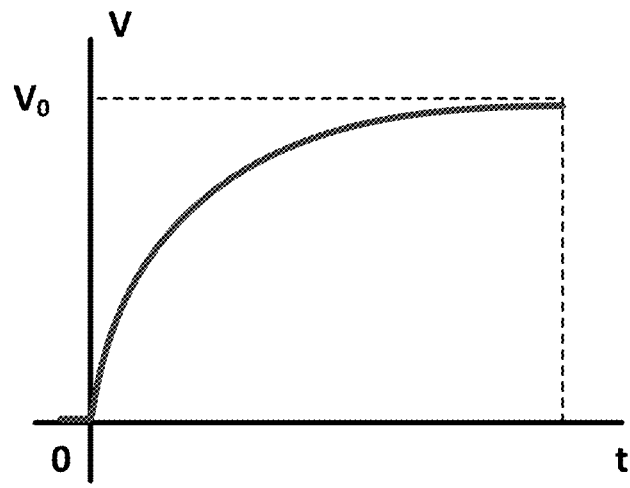
FIG. 11A illustrates a transfer curve of a PWM-based multibit analog representation technique using the first order step response of the capacitor charging.

Linearity is one of the key performance indicators for the performance quantification of in-memory computing methods. Although currently PWM and VCM are the two most adopted techniques, both of them suffer great performance degradations due to their nonlinearity transfer curves. As shown in FIG. 11A, PWM uses the first order response relationship between time and the voltage difference between a capacitor given as:

$$V_C = V_0(1 - e^{-t/RC})$$

where $V_C$ is the voltage (electric potential difference) across the capacitor, $V_0$ is the voltage of the source, t is the charging time, R is the serial parasitic resistance, and the C is the capacitance of the capacitor and the parasitic capacitor.

Figure 11B:
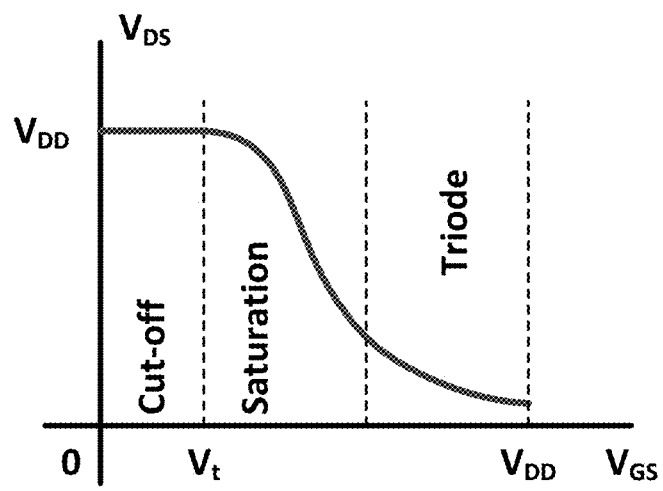
FIG. 11B illustrates a transfer curve of $V_{DS}$ vs. $V_{GS}$ in a MOSFET for a VCM-based multibit analog representation technique.

As for VCM, it is more complicated. FIG. 11B provides the transfer curve used in VCM, a relationship between the gate-to-source voltage ($V_{GS}$) and the drain-to-source voltage ($V_{DS}$) in a metal-oxide-semiconductor field-effect transistor (MOSFET) transistor. Crossing three different regions (cut-off, saturation, and triode), the linearity of this curve is far from a straight line. A notable loss is expected on the actual effective number of bits of the PWM and VCM multibit analog representation methods. Consequently, additional compensation and/or predistortion methods are required to bring these techniques back to a reasonable region.

Figure 12A:
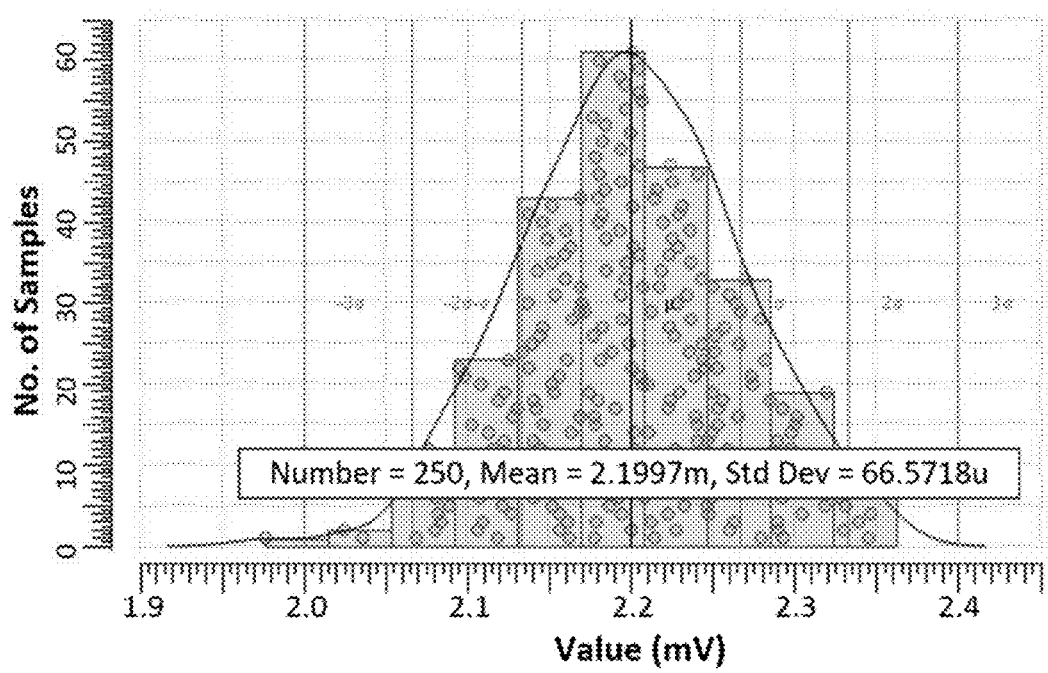
FIG. 12A illustrates a minimum variation distribution (code 0) and FIG. 12B illustrates a maximum variation distribution (code 127), respectively, of the single-ended C-2C ladder network for multibit representation with 1 fF unit capacitance according to the circuit level components mismatch Monte Carlo simulation results, in accordance with various embodiments.
Figure 12B:
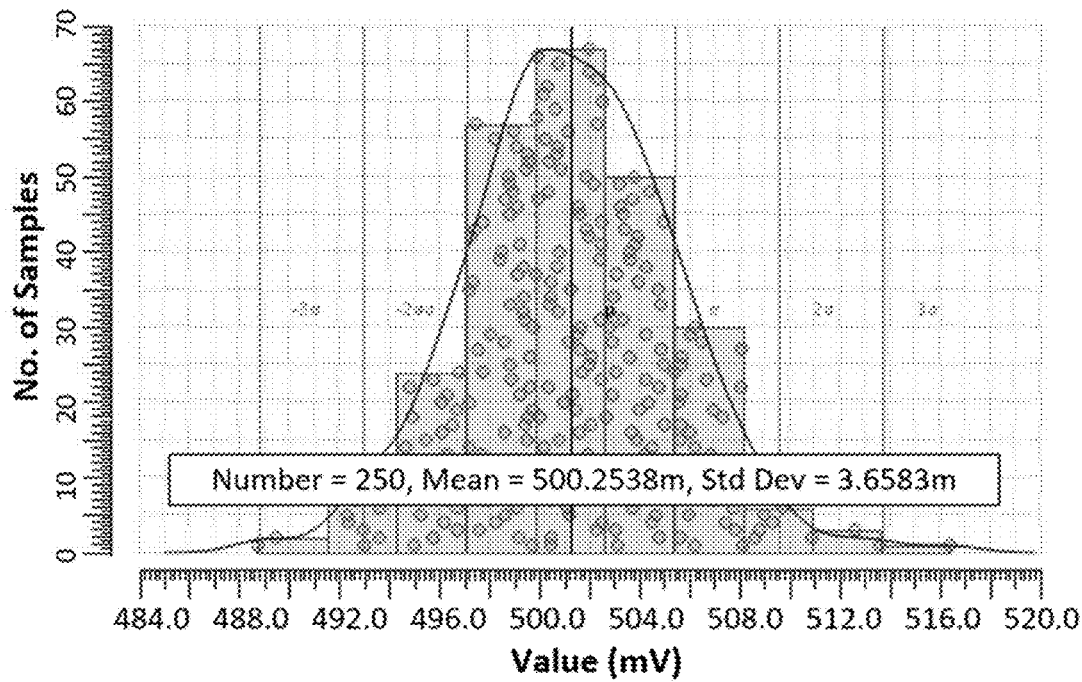
Figure 13A:
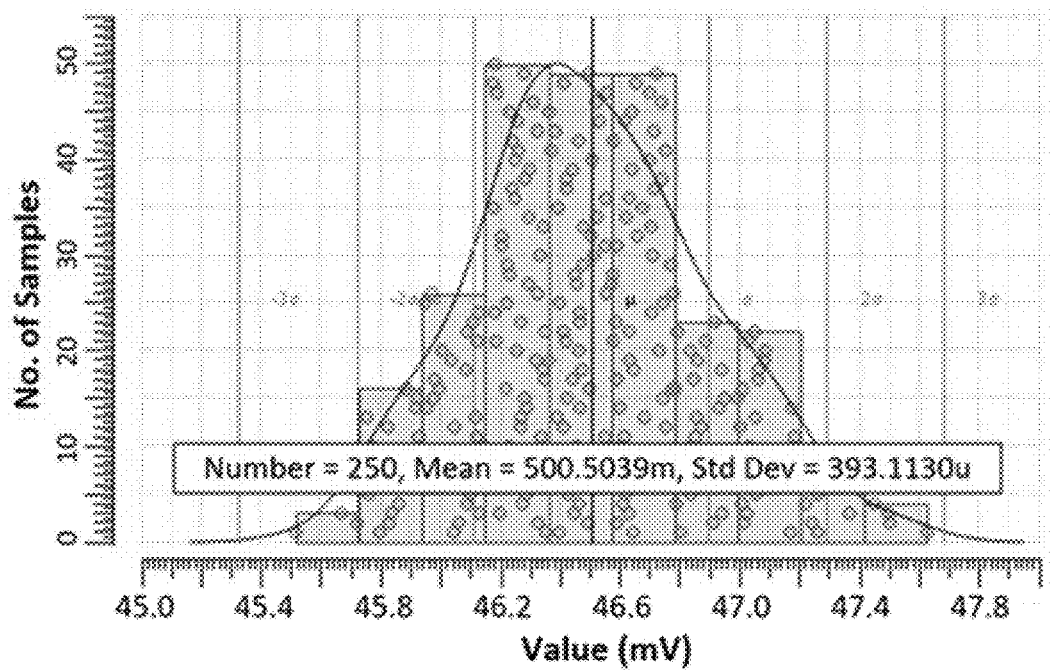
FIG. 13A illustrates a minimum variation distribution (code 0) and FIG. 13B illustrates a maximum variation distribution (code 127), respectively, of the differential C-2C ladder network for multibit representation with 1 fF unit capacitance according to the circuit level components mismatch Monte Carlo simulation results, in accordance with various embodiments.
Figure 13B:
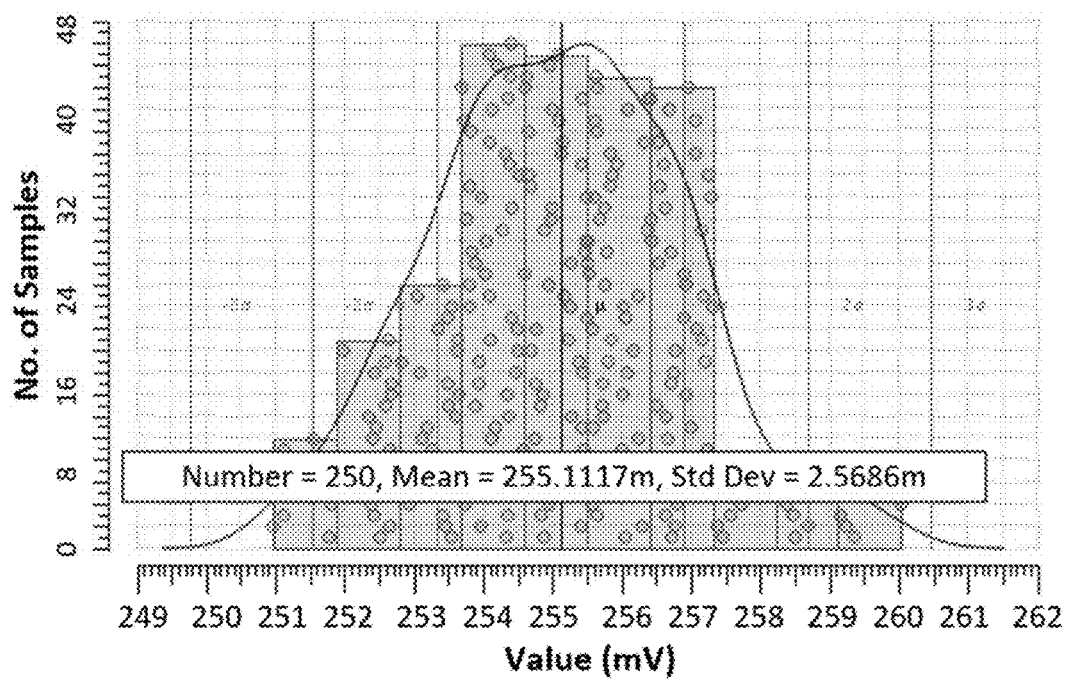
Figure 14A:
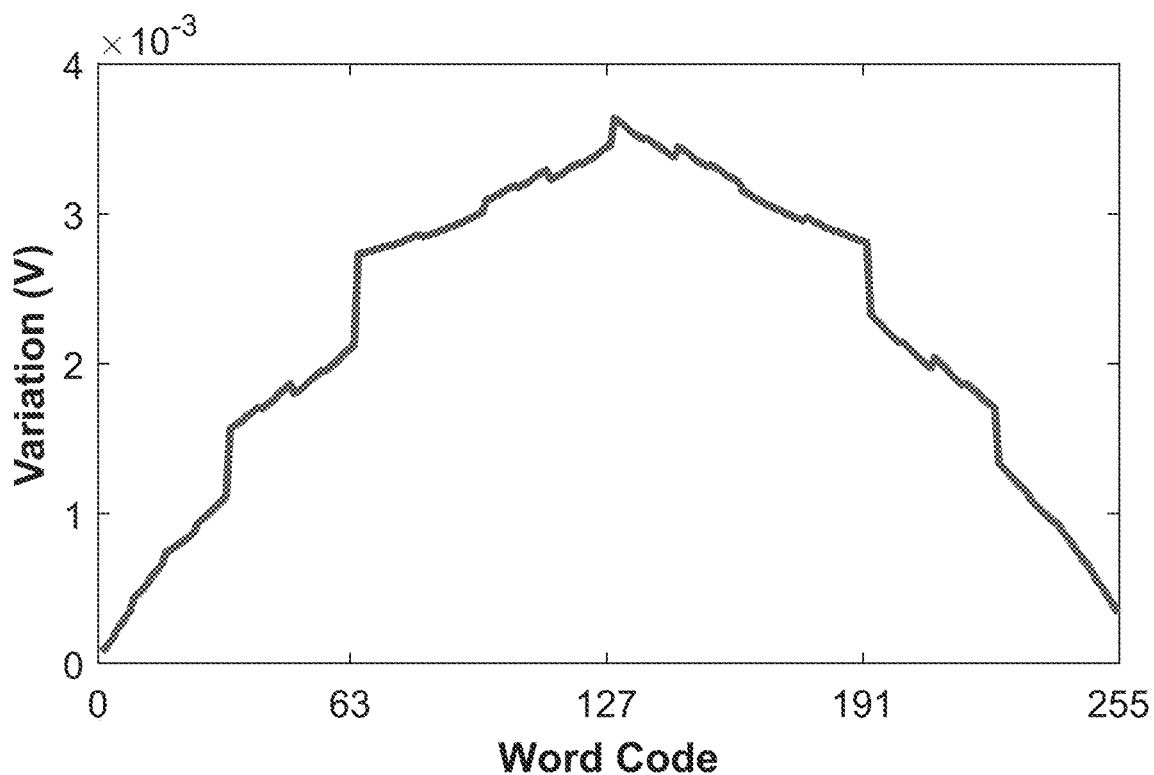
FIG. 14A illustrates summarized variation vs. code results of the single-ended C-2C ladder with 1 fF unit capacitance, in accordance with various embodiments.
Figure 14B:
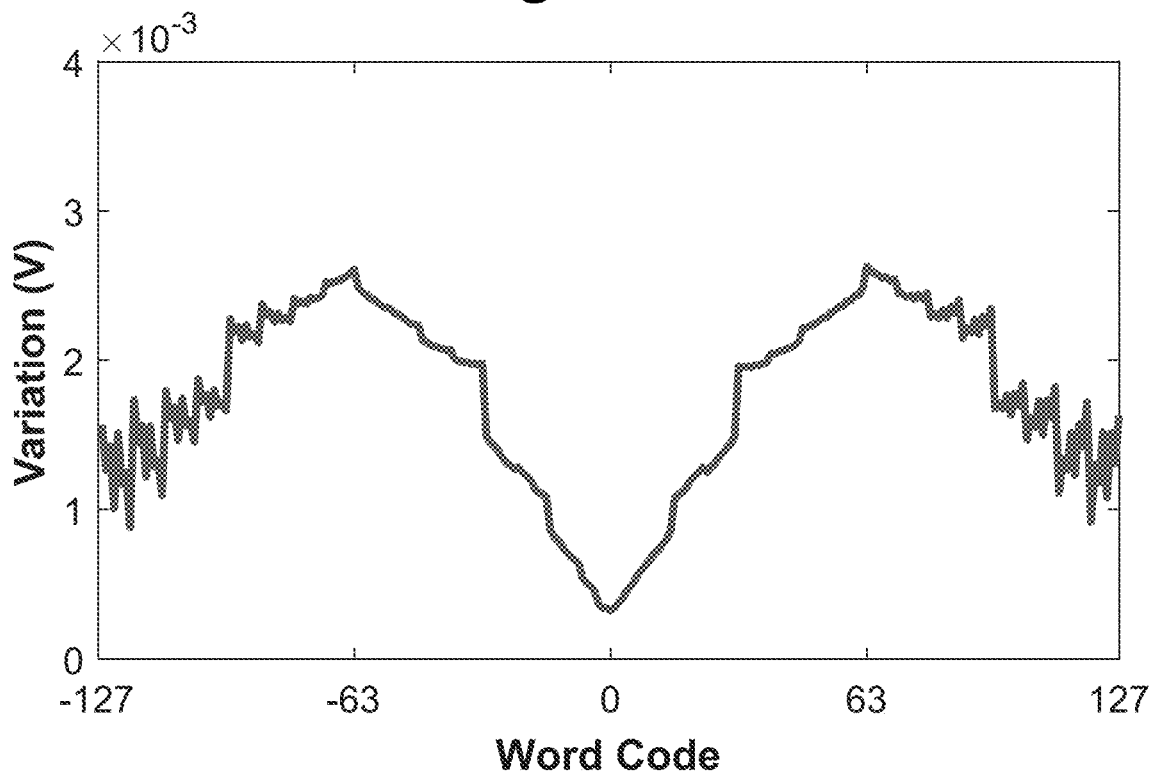
FIG. 14B illustrates summarized variation vs. code results of the differential C-2C ladder with 1 fF unit capacitance, in accordance with various embodiments.

In contrast, the techniques described herein provides a linear charge superposition with a perfect linearity under ideal situation. The only nonideality in this topology comes from the mismatch between the capacitors in the ladder network caused by process variation during manufacturing. Circuit level Monte Carlo simulations were performed to verify the concept. FIGS. 12, 13, and 14 provide the variation results of the single-ended scheme (e.g., the ladder network 200 of FIG. 2) and the differential scheme (e.g., the differential ladder circuit 700 of FIG. 7). For the simulations, the LSB in a 1-volt 8-bit single-ended system is defined as $\frac{1}{2^8}=4$ mV, while it is $\frac{1}{2^7}=8$ mV for the differential case. FIGS. 12 and 13 present the maximum variations in both cases. It can be clearly observed in FIG. 12 that the variance of the single-ended ladder is around 3.7 mV, greater than half of the LSB (4 mV/2), indicating a one bit NoB loss. In FIG. 13, the maximum variation is around 2.6 mV, which is smaller than half of the LSB (8 mV/2). The overall variation vs. code curves are given in FIG. 14. Compared with the PWM and VCM techniques, the techniques described herein provide more than 10× times better linearity performance. As a result, no additional linearity compensation technique may be required. The linearization process typically requires additional hardware, power, and process time to implement, which may be saved by the techniques described herein.

Example System

Figure 15:
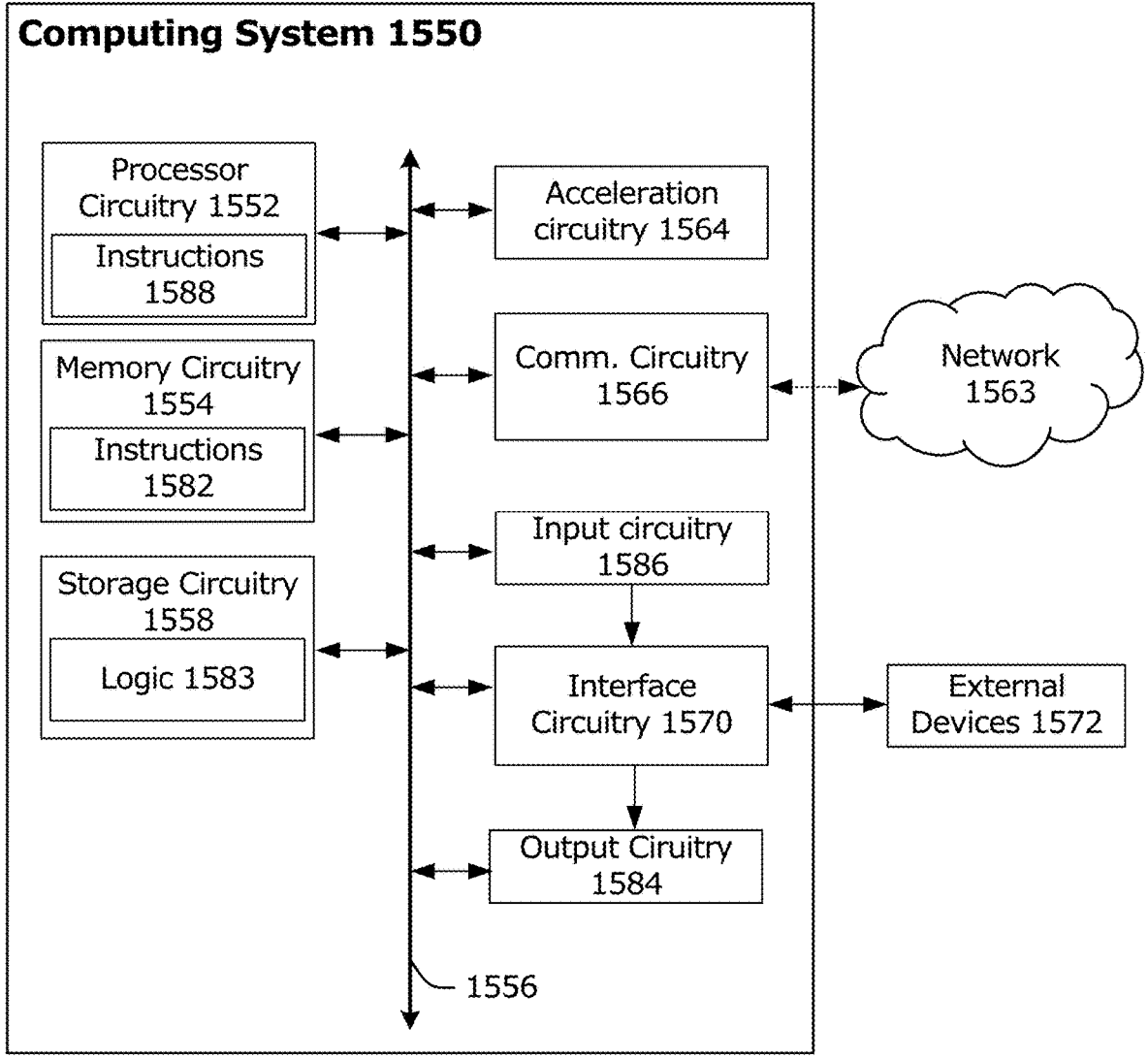
FIG. 15 illustrates an example system configured to employ the apparatuses and methods described herein, in accordance with various embodiments.

FIG. 15 illustrates an example of components that may be present in a computing system 1550 for implementing the techniques (e.g., operations, processes, methods, and methodologies) described herein. The computing system 1550 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1550, or as components otherwise incorporated within a chassis of a larger system. For one embodiment, at least one processor 1552 may be packaged together with computational logic 1582 and configured to practice aspects of various example embodiments described herein to form a System in Package (SiP) or a System on Chip (SoC).

The system 1550 includes processor circuitry in the form of one or more processors 1552. The processor circuitry 1552 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1552 may include one or more hardware accelerators (e.g., same or similar to acceleration circuitry 1564), which may be microprocessors, programmable processing devices (e.g., FPGA, ASIC, etc.), or the like. The one or more accelerators may include, for example, computer vision and/or deep learning accelerators. In some implementations, the processor circuitry 1552 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1552 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1552 may be coupled with or may include memory/storage and may be configured to execute instructions stored in the memory/storage to enable various applications or operating systems to run on the platform 1550. The processors (or cores) 1552 is configured to operate application software to provide a specific service to a user of the platform 1550. In some embodiments, the processor(s) 1552 may be a special-purpose processor(s)/controller(s) configured (or configurable) to operate according to the various embodiments herein.

As examples, the processor(s) 1552 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1552 may be a part of a system on a chip (SoC), System-in-Package (SiP), a multi-chip package (MCP), and/or the like, in which the processor(s) 1552 and other components are formed into a single integrated circuit, or a single package, such as the Edison™ or Galileo™ SoC boards from Intel® Corporation. Other examples of the processor(s) 1552 are mentioned elsewhere in the present disclosure.

The system 1550 may include or be coupled to acceleration circuitry 1564, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1564 may comprise logic blocks or logic fabric and other interconnected resources that may be programmed (configured) to perform various functions, such as the procedures, methods, functions, etc. of the various embodiments discussed herein. In such implementations, the acceleration circuitry 1564 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1552 and/or acceleration circuitry 1564 may include hardware elements specifically tailored for machine learning and/or artificial intelligence (AI) functionality, such as for performing BNN operations such as those discussed herein. In these implementations, the processor circuitry 1552 and/or acceleration circuitry 1564 may be, or may include, an AI engine chip that can run many different kinds of AI instruction sets once loaded with the appropriate weightings and training code. Additionally or alternatively, the processor circuitry 1552 and/or acceleration circuitry 1564 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1552 and/or acceleration circuitry 1564 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the Hi Silicon Kirin 970 provided by Huawei®, and/or the like. In some hardware-based implementations, individual subsystems of system 1550 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream (s), etc. to perform their respective functions.

The system 1550 also includes system memory 1554. Any number of memory devices may be used to provide for a given amount of system memory. As examples, the memory 1554 may be, or include, volatile memory such as random access memory (RAM), static RAM (SRAM), dynamic RAM (DRAM), synchronous DRAM (SDRAM), RAM-BUS® Dynamic Random Access Memory (RDRAM®), and/or any other desired type of volatile memory device. Additionally or alternatively, the memory 1554 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1554 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1558 provides persistent storage of information such as data, applications, operating systems and so forth. In an example, the storage 1558 may be implemented via a solid-state disk drive (SSDD) and/or high-speed electrically erasable memory (commonly referred to as "flash memory"). Other devices that may be used for the storage 1558 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1554 and/or storage circuitry 1558 may also incorporate three-dimensional (3D) cross-point (XPOINT) memories from Intel® and Micron®.

The memory circuitry 1554 and/or storage circuitry 1558 is/are configured to store computational logic 1583 in the form of software, firmware, microcode, or hardware-level instructions to implement the techniques described herein. The computational logic 1583 may be employed to store working copies and/or permanent copies of programming instructions, or data to create the programming instructions, for the operation of various components of system 1500 (e.g., drivers, libraries, application programming interfaces (APIs), etc.), an operating system of system 1500, one or more applications, and/or for carrying out the embodiments discussed herein. The computational logic 1583 may be stored or loaded into memory circuitry 1554 as instructions 1582, or data to create the instructions 1582, which are then accessed for execution by the processor circuitry 1552 to carry out the functions described herein. The processor circuitry 1552 and/or the acceleration circuitry 1564 accesses the memory circuitry 1554 and/or the storage circuitry 1558 over the interconnect (IX) 1556. The instructions 1582 direct the processor circuitry 1552 to perform a specific sequence or flow of actions, for example, as described with respect to flowchart(s) and block diagram(s) of operations and functionality depicted previously. The various elements may be implemented by assembler instructions supported by processor circuitry 1552 or high-level languages that may be compiled into instructions 1581, or data to create the instructions 1581, to be executed by the processor circuitry 1552. The permanent copy of the programming instructions may be placed into persistent storage devices of storage circuitry 1558 in the factory or in the field through, for example, a distribution medium (not shown), through a communication interface (e.g., from a distribution server (not shown)), over-the-air (OTA), or any combination thereof.

The IX 1556 couples the processor 1552 to communication circuitry 1566 for communications with other devices, such as a remote server (not shown) and the like. The communication circuitry 1566 is a hardware element, or collection of hardware elements, used to communicate over one or more networks 1563 and/or with other devices. In one example, communication circuitry 1566 is, or includes, transceiver circuitry configured to enable wireless communications using any number of frequencies and protocols such as, for example, the Institute of Electrical and Electronics Engineers (IEEE) 802.11 (and/or variants thereof), IEEE 802.15.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1566 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1556 also couples the processor 1552 to interface circuitry 1570 that is used to connect system 1550 with one or more external devices 1572. The external devices 1572 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1550, which are referred to as input circuitry 1586 and output circuitry 1584 in FIG. 15. The input circuitry 1586 and output circuitry 1584 include one or more user interfaces designed to enable user interaction with the platform 1550 and/or peripheral component interfaces designed to enable peripheral component interaction with the platform 1550. Input circuitry 1586 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1584 may be included to show information or otherwise convey information, such as sensor readings, actuator position(s), or other like information. Data and/or graphics may be displayed on one or more user interface components of the output circuitry 1584. Output circuitry 1584 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1550. The output circuitry 1584 may also include speakers and/or other audio emitting devices, printer(s), and/or the like. Additionally or alternatively, sensor(s) may be used as the input circuitry 1584 (e.g., an image capture device, motion capture device, or the like) and one or more actuators may be used as the output device circuitry 1584 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1550 may communicate over the IX 1556. The IX 1556 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1556 may be a proprietary bus, for example, used in a SoC based system.

The number, capability, and/or capacity of the elements of system 1500 may vary, depending on whether computing system 1500 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1500 may comprise one or more components of a data center, a desktop computer, a workstation, a laptop, a smartphone, a tablet, a digital camera, a smart appliance, a smart home hub, a network appliance, and/or any other device/system that processes data.

EXAMPLES

Some non-limiting Examples of various embodiments are provided below.

Example 1 includes a circuit (e.g., an in-memory computing circuit) comprising: a memory array including a plurality of memory cells to store respective digital bits; and a ladder network coupled to the memory array to convert a set of the digital bits to an analog value. The ladder network includes: an output line coupled to an output terminal to provide the analog value; and a plurality of branches coupled to the output line. Individual branches include: a capacitor with a first terminal coupled to the output line; and a switch coupled to a second terminal of the capacitor, wherein the switch is controlled by a respective digital bit of the set of digital bits to selectively couple the second terminal of the capacitor to a first voltage node or a second voltage node based on a value of the respective digital bit.

Example 2 is the circuit of Example 1, wherein the ladder network further includes scaling capacitors coupled along the output line between respective branches of some or all of the plurality of branches.

Example 3 is the circuit of Example 2, wherein the capacitors of two or more adjacent branches of the plurality of branches have a same capacitance value.

Example 4 is the circuit of Example 3, wherein the capacitance value is a first capacitance value, and wherein the scaling capacitors have a second capacitance value that is twice the first capacitance value.

Example 5 is the circuit of Example 4, wherein the capacitor of one or more of the branches that are coupled to the output line closest to an output node have a different capacitance value than the first capacitance value.

Example 6 is the circuit of Example 5, wherein the plurality of branches include a first branch that is coupled to the output line closest to the output terminal and a second branch that is coupled to the output line second closest to the output terminal, wherein the capacitor of the first branch has a third capacitance value that is four times the first capacitance value, wherein the capacitor of the second branch has the second capacitance value, wherein there is no scaling capacitor coupled between the first and second branches on the output line.

Example 7 is the circuit of Example 6, wherein the remaining branches of the plurality of branches have the first capacitance value.

Example 8 is the circuit of Example 1, wherein the output terminal is coupled to a first end of the output line, and wherein the ladder network further includes another capacitor coupled between a second end of the output line and ground.

Example 9 is the circuit of Example 1, wherein the first voltage node is to receive ground potential and the second voltage node is to receive a supply voltage.

Example 10 is the circuit of Example 1, wherein the ladder network is a first ladder network, wherein the analog value is a first analog value, and wherein the circuit further includes a second ladder network to generate a second analog value based on the set of digital bits, wherein the first analog value and the second analog value combine to provide a differential output signal.

Example 11 is the circuit of Example 10, wherein the first voltage node of both the first and second ladder networks is to receive half of a supply voltage, and wherein the circuit further includes a sign switch to receive a sign bit associated with the set of digital bits and provide the supply voltage or a ground potential to respective second voltage nodes of the first and second ladder networks based on the sign bit.

Example 12 is the circuit of Example 1, wherein the memory cells are static random access memory (SRAM) cells, dynamic random access memory (DRAM) cells, magnetoresistive random access memory (MRAM) cells, phase change random access memory (PCRAM) cells ferroelectric random access memory (FeRAM), or flash memory.

Example 13 is a circuit (e.g., an in-memory computing circuit) comprising: a memory array including a plurality of memory cells to store respective digital bits; and a first ladder network and a second ladder network coupled to the memory array to convert a set of the digital bits to a differential analog value. The first and second ladder networks each include: an output line coupled to a respective output terminal to provide a respective component of the differential analog value; and a plurality of branches coupled to the output line. The individual branches include: a capacitor with a first terminal coupled to the output line; and a switch coupled to a second terminal of the capacitor, wherein the switch is controlled by a respective digital bit of the set of digital bits to selectively couple the second terminal of the capacitor to a first terminal or a second terminal based on a value of the respective digital bit, wherein the first terminal is to receive a first voltage. The circuit further includes a sign switch to receive a sign bit associated with the set of digital bits and to selectively couple the second terminals of the first and second ladder networks to different ones of a second voltage and a ground potential based on the sign bit, wherein the second voltage is twice the first voltage.

Example 14 is the circuit of Example 13, wherein the first and second ladder networks further includes scaling capacitors coupled along the output line between respective branches of the plurality of branches, and wherein the capacitors of at least half of the plurality of branches have a same capacitance value.

Example 15 is the circuit of Example 14, wherein the capacitance value is a first capacitance value, and wherein the scaling capacitors have a second capacitance value that is twice the first capacitance value.

Example 16 is the circuit of Example 15, wherein the capacitor of one or more of the branches that are coupled to the output line closest to an output node have a different capacitance value than the first capacitance value, and wherein remaining branches of the plurality of branches have the first capacitance value.

Example 17 is the circuit of Example 14, wherein the capacitors of all of the branches have the same capacitance value.

Example 18 is the circuit of Example 13, wherein the output terminal is coupled to a first end of the output line, and wherein the first and second ladder networks each further include another capacitor coupled between a second end of the respective output line and ground.

Example 19 is the circuit of Example 13, wherein the sign switch is a butterfly switch.

Example 20 is a computer system comprising: a memory circuit and one or more processors. The memory circuit includes: a memory array including a plurality of memory cells to store respective digital bits; and a ladder network coupled to the memory array to convert a set of the digital bits to an analog value. The ladder network includes: an output line coupled to an output terminal to provide the analog value; and a plurality of branches coupled to the output line. Individual branches include: a capacitor with a first terminal coupled to the output line; and a switch coupled to a second terminal of the capacitor, wherein the switch is controlled by a respective digital bit of the set of digital bits to selectively couple the second terminal of the capacitor to a first voltage node or a second voltage node based on a value of the respective digital bit. The ladder network further includes scaling capacitors coupled on the output line between respective branches of a group of some or all of the plurality of branches, wherein the capacitors of the group of branches have a same capacitance value. The one or more processors are coupled to the memory circuit to receive the analog value.

Example 21 is the computer system of Example 20, wherein the group of branches includes a subset of the plurality of branches, and wherein the plurality of branches further includes one or more other branches that are coupled to the output line closest to an output node that have respective capacitors with a different capacitance value, wherein there is no scaling capacitor on the output line between the one or more other branches.

Example 22 is the computer system of Example 20, wherein the group of branches includes all of the plurality of branches.

Example 23 is the computer system of Example 20, wherein the first voltage node is to receive ground potential and the second voltage node is to receive a supply voltage.

Example 24 is the computer system of Example 20, wherein the ladder network is a first ladder network, wherein the analog value is a first analog value, and wherein the memory circuit further includes: a second ladder network to generate a second analog value based on the set of digital bits, wherein the first voltage node of both the first and second ladder networks is to receive half of a supply voltage, and wherein the first analog value and the second analog value combine to provide a differential output signal; and a sign switch to receive a sign bit associated with the set of bits and provide the supply voltage or a ground potential to respective second voltage nodes of the first and second ladder networks based on the sign bit.

Example 25 includes the computer system of Example 20, wherein the computer system is to implement a neural network.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a memory array including a plurality of memory cells to store respective digital bits; and
   a ladder network coupled to the memory array to convert a set of the digital bits to an analog value, wherein the ladder network includes:
   an output line coupled to an output terminal to provide the analog value; and
   a plurality of branches coupled to the output line, wherein individual branches include:
   a capacitor with a first terminal coupled to the output line; and
   a switch coupled to a second terminal of the capacitor, wherein the switch is controlled by a respective digital bit of the set of digital bits to selectively couple the second terminal of the capacitor to a first voltage node or a second voltage node based on a value of the respective digital bit.

2. The circuit of claim 1, wherein the ladder network further includes scaling capacitors coupled along the output line between respective branches of some or all of the plurality of branches.

3. The circuit of claim 2, wherein the capacitors of two or more adjacent branches of the plurality of branches have a same capacitance value.

4. The circuit of claim 3, wherein the capacitance value is a first capacitance value, and wherein the scaling capacitors have a second capacitance value that is twice the first capacitance value.

5. The circuit of claim 4, wherein the capacitor of one or more of the branches that are coupled to the output line closest to an output node have a different capacitance value than the first capacitance value.

6. The circuit of claim 5, wherein the plurality of branches include a first branch that is coupled to the output line closest to the output terminal and a second branch that is coupled to the output line second closest to the output terminal, wherein the capacitor of the first branch has a third capacitance value that is four times the first capacitance value, wherein the capacitor of the second branch has the second capacitance value, wherein there is no scaling capacitor coupled between the first and second branches on the output line.

7. The circuit of claim 6, wherein the remaining branches of the plurality of branches have the first capacitance value.

8. The circuit of claim 1, wherein the output terminal is coupled to a first end of the output line, and wherein the ladder network further includes another capacitor coupled between a second end of the output line and ground.

9. The circuit of claim 1, wherein the first voltage node is to receive ground potential and the second voltage node is to receive a supply voltage.

10. The circuit of claim 1, wherein the ladder network is a first ladder network, wherein the analog value is a first analog value, and wherein the circuit further includes a second ladder network to generate a second analog value based on the set of digital bits, wherein the first analog value and the second analog value combine to provide a differential output signal.

11. The circuit of claim 10, wherein the first voltage node of both the first and second ladder networks is to receive half of a supply voltage, and wherein the circuit further includes a sign switch to receive a sign bit associated with the set of digital bits and provide the supply voltage or a ground potential to respective second voltage nodes of the first and second ladder networks based on the sign bit.

12. The circuit of claim 1, wherein the memory cells are static random access memory (SRAM) cells, dynamic random access memory (DRAM) cells, magnetoresistive random access memory (MRAM) cells, phase change random access memory (PCRAM) cells ferroelectric random access memory (FeRAM), or flash memory.

13. A circuit comprising:
a memory array including a plurality of memory cells to store respective digital bits; and
a first ladder network and a second ladder network coupled to the memory array to convert a set of the digital bits to a differential analog value, wherein the first and second ladder networks each include:
an output line coupled to a respective output terminal to provide a respective component of the differential analog value; and
a plurality of branches coupled to the output line, wherein individual branches include:
a capacitor with a first terminal coupled to the output line; and
a switch coupled to a second terminal of the capacitor, wherein the switch is controlled by a respective digital bit of the set of digital bits to selectively couple the second terminal of the capacitor to a first terminal or a second terminal based on a value of the respective digital bit, wherein the first terminal is to receive a first voltage;
a sign switch to receive a sign bit associated with the set of digital bits and to selectively couple the second terminals of the first and second ladder networks to different ones of a second voltage and a ground potential based on the sign bit, wherein the second voltage is twice the first voltage.

14. The circuit of claim 13, wherein the first and second ladder networks further includes scaling capacitors coupled along the output line between respective branches of the plurality of branches, and wherein the capacitors of at least half of the plurality of branches have a same capacitance value.

15. The circuit of claim 14, wherein the capacitance value is a first capacitance value, and wherein the scaling capacitors have a second capacitance value that is twice the first capacitance value.

16. The circuit of claim 15, wherein the capacitor of one or more of the branches that are coupled to the output line closest to an output node have a different capacitance value than the first capacitance value, and wherein remaining branches of the plurality of branches have the first capacitance value.

17. The circuit of claim 14, wherein the capacitors of all of the branches have the same capacitance value.

18. The circuit of claim 13, wherein the output terminal is coupled to a first end of the output line, and wherein the first and second ladder networks each further include another capacitor coupled between a second end of the respective output line and ground.

19. The circuit of claim 13, wherein the sign switch is a butterfly switch.

20. A computer system comprising:
a memory circuit including:
a memory array including a plurality of memory cells to store respective digital bits; and
a ladder network coupled to the memory array to convert a set of the digital bits to an analog value, wherein the ladder network includes:
an output line coupled to an output terminal to provide the analog value;
a plurality of branches coupled to the output line, wherein individual branches include:
a capacitor with a first terminal coupled to the output line; and
a switch coupled to a second terminal of the capacitor, wherein the switch is controlled by a respective digital bit of the set of digital bits to selectively couple the second terminal of the capacitor to a first voltage node or a second voltage node based on a value of the respective digital bit; and
scaling capacitors coupled on the output line between respective branches of a group of some or all of the plurality of branches, wherein the capacitors of the group of branches have a same capacitance value; and
one or more processors coupled to the memory circuit to receive the analog value.

21. The computer system of claim 20, wherein the group of branches includes a subset of the plurality of branches, and wherein the plurality of branches further includes one or more other branches that are coupled to the output line closest to an output node that have respective capacitors with a different capacitance value, wherein there is no scaling capacitor on the output line between the one or more other branches.

22. The computer system of claim 20, wherein the group of branches includes all of the plurality of branches.

23. The computer system of claim 20, wherein the first voltage node is to receive ground potential and the second voltage node is to receive a supply voltage.

24. The computer system of claim 20, wherein the ladder network is a first ladder network, wherein the analog value is a first analog value, and wherein the memory circuit further includes:
  a second ladder network to generate a second analog value based on the set of digital bits, wherein the first voltage node of both the first and second ladder networks is to receive half of a supply voltage, and wherein the first analog value and the second analog value combine to provide a differential output signal; and
  a sign switch to receive a sign bit associated with the set of bits and provide the supply voltage or a ground potential to respective second voltage nodes of the first and second ladder networks based on the sign bit.

25. The computer system of claim 20, wherein the computer system is to implement a neural network.

* * * * *